July 1, 1969 W. G. BEDUHN 3,452,770

CONTROL APPARATUS

Filed Sept. 9, 1966

INVENTOR.
WILLIAM G. BEDUHN
BY Charles J. Ungemach
ATTORNEY

United States Patent Office 3,452,770
Patented July 1, 1969

3,452,770
CONTROL APPARATUS

William G. Beduhn, Minneapolis, Minn., assignor to Honeywell Inc., Minneapolis, Minn., a corporation of Delaware Filed Sept. 9, 1966, Ser. No. 578,350
Int. Cl. F15c *1/12*
U.S. Cl. 137—81.5 7 Claims

ABSTRACT OF THE DISCLOSURE

A fluidic shaping circuit whose fluid output signal changes in magnitude when the pressure of a fluid reference source drops below a predetermined value. The circuit contains a fluid resistance designed to operate in a sonic condition when the predetermined reference pressure is reached.

The present invention relates to pure fluid devices and more particularly to a fluidic shaping circuit operable to produce a fluid output signal which changes in magnitude with changes in input signal in a predetermined desired manner.

For convenience the invention will be described for use with a rate damper system for an aircraft. In such a system it has been found desirable that the gain of the system remain constant throughout a predetermined range of relatively low altitudes but when the aircraft is operating above this range it is desirable that the gain of the system change with changes in altitude.

Fluid amplifiers and amplifier cascades which are operable to change gain in accordance with input signal magnitude are known in the art. For example the copending application of Richard A. Evans, Serial No. 578,006, filed September 8, 1966, and assigned to the assignee of the present invention shows such apparatus. Such gain changing amplifiers may be used in a rate damper system to change the gain thereof. The present invention may then be used to supply the input signal to the gain changing amplifier so that its gain and the gain of the system changes with aircraft altitude in the predetermined desired manner. More specifically, the present invention supplies a constant signal to the input of the gain changing amplifier whenever the aircraft operates in the predetermined range of relatively low altitudes so that the gain of the amplifier and the system remains constant in this range. Above the predetermined range, the present invention supplies an input signal to the gain changing amplifier which changes with changes in altitude so that the gain of the amplifier and the system changes in the desired manner.

While the invention is herein described in relationship to controlling the gain of an amplifier and more specifically to controlling the gain of a rate damper system for an aircraft, it will be understood that the invention may be used wherever it is desired to have a fluid signal which varies in a predetermined manner with a variable condition.

For a better understanding of this invention, reference should be had to the accompanying drawings wherein.

Figure 1:
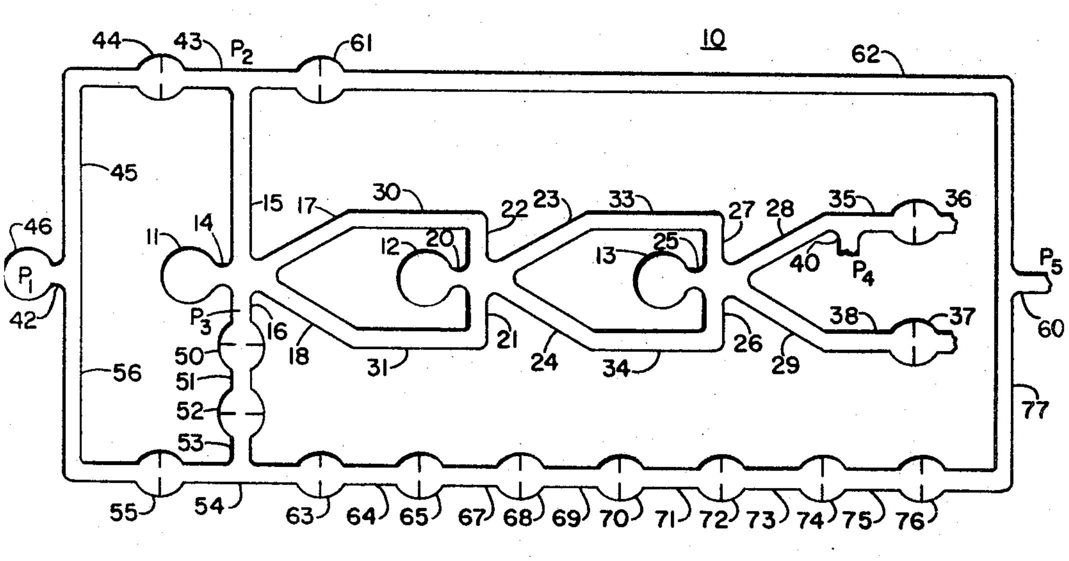
FIGURE 1 shows my fluidic shaping circuit.

Referring now to FIGURE 1 reference numeral 10 generally depicts my fluidic shaping circuit. A first fluid amplifier 11, a second fluid amplifier 12, and a third fluid amplifier 13 are shown in the fluidic shaping circuit. It is not necessary that there be three fluid amplifiers for the operation of the circuit, more or less fluid amplifiers will operate satisfactorily in my fluidic shaping circuit. Fluid amplifiers 11, 12 and 13 are proportional fluid amplifiers but other types of fluid amplifiers could also be used. Fluid amplifier 11 has a power nozzle 14, a first control port 15, a second control port 16, an outlet leg 17, and an outleg leg 18. Fluid amplifier 12 has a power nozzle 20, a first control port 21, a second control port 22, an outlet leg 23, and an outlet leg 24. Similarly fluid amplifier 13 has a power nozzle 25, a first control port 26, a second control port 27, an outlet leg 28, and an outlet leg 29. The fluid amplifiers 11, 12, and 13 are powered by a fluid source not shown in the drawing.

Fluid amplifier outlet leg 17 is connected to fluid amplifier control port 22 through a passage 30 and fluid amplifier outlet leg 18 is connected to control passage 21 through a passage 31. Similarly, fluid amplifier outlet leg 23 is connected to fluid amplifier control passage 27 through a passage 33 and fluid amplifier outlet leg 24 is connected to fluid amplifier control passage 26 through a passage 34. Connected to the fluid amplifier outlet leg 28 is a passage 35 which in turn connects to a fluid resistor 36. Fluid resistor 36 may be an orifice or the like, which cause fluid pressure to drop as fluid flows therethrough. An outlet passage 40 is provided in passage 35 for supplying the desired fluid output pressure signal. Fluid amplifier outlet leg 29 is connected to fluid resistor 37 through a passage 38.

Fluid amplifier control port 15 is connected to a source of fluid 46, that is supplied at a constant pressure $P_1$ through a fluid passage 43, a fluid resistor 44, a fluid passage 45 and a fluid passage 42. Likewise, fluid amplifier control port 16 is connected to the source of fluid 46 through a fluid resistor 50, a fluid passage 51, a fluid resistor 52, a fluid passage 53, a fluid passage 54, a fluid resistor 55, a fluid passage 56 and the fluid passage 42.

Passage 43 is connected to a passage 60 through a resistor 61 and a fluid passage 62. Similarly passage 54 is connected to passage 60 through a fluid resistor 63, a passage 64, a fluid resistor 65, a passage 67, a fluid resistor 68, a passage 69, a fluid resistor 70, a passage 71, a fluid resistor 72, a passage 73, a fluid resistor 74, a passage 75, a fluid resistor 76 and a passage 77.

In the operation of my fluidic shaping circuit 10 in an aircraft, fluid at a constant pressure $P_1$ is supplied from source 46 to the fluid resistors 44 and 55. The outlet pressure $P_5$ at the passage 60 is the reference pressure of the pressure that is associated with a particular altitude, and hence will vary as the altitude of the aircraft is increased or decreased. The pressure at the control port 15 of fluid amplifier 11 is denoted by the symbol $P_2$, and the pressure at the control port 16 of fluid amplifier 11 is denoted by the symbol $P_3$. When the pressure $P_5$ decreases, as it would with an increase in altitude, the pressures $P_2$ and $P_3$ both initially tend to decrease as show in FIGURE 2.

The values of the resistors in the fluidic shaping circuit 10 are selected so that a greater amount of resistance is offered to the fluid flowing from source 46 through passage 42, passage 56, resistor 55, passage 54, resistors 63, 65, 68, 70, 72, 74, and 76 than to the resistance to the fluid flowing from source 46, through passage 42, resistor 44, passage 43 and resistor 61. Hence, the pressure at control passage 16 denoted by $P_3$ will be greater than the pressure at control passage 15 denoted by $P_2$. In order to adjust pressure $P_3$ to the proper level, resistances such as 50 or 52 may be inserted as well as changing the value of resistor 55. With a control pressure $P_3$ greater than $P_2$, a fluid differential signal exists across fluid amplifier control ports 15 and 16 causing a portion of the fluid stream from power nozzle 14 to flow into outlet leg 17, into passage 30, into control passage 22 and direct the fluid stream from fluid power nozzle 20 into outlet leg 24, and therefrom into passage 34 and into control port 26. The fluid signal present at control passage 26 directs the fluid stream from power nozzle 25 into outlet leg 28 and hence through passage 35 and through resistor 36. The fluid output pressure signal $P_4$ is obtained at passage 40. In other words, if the pressure $P_3$ in control passage 16 is greater than the pressure $P_2$ in control passage 15 of fluid amplifier 11 the fluid exhausts out through resistor 36.

Figure 3:
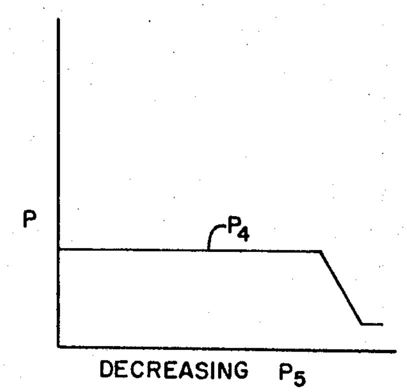
FIGURE 3 shows the output pressure $P_4$ of the fluidic shaping circuit shown in FIGURE 1.

When the pressure $P_5$ is initially decreased, the pressure $P_2$ and $P_3$ at the control ports 15 and 16 also decreases but the pressure differential between control ports 15 and 16 tends to remain approximately constant. If the pressure differential $P_3-P_2$ does not remain constant a smooth output curve as shown in FIGURE 3 can be obtained by operating the fluid amplifiers 11, 12, and 13 in a saturated state. That is, the signal $P_3-P_2$ is in a range in which further increases in the differential signal $P_3-P_2$ does not result in any variation of the output signal at outlet passage 40 until the pressure differential level $P_3-P_2$ reaches a predetermined minimum level that causes the output signal at passage 40 to vary. That is, as the pressure $P_5$ begins to decrease, the pressure $P_2$ tends to decrease at the same rate as the pressure $P_3$. However, when a condition known as a "sonic condition" occurs at fluid resistor 61, the pressure $P_2$ no longer decreases with decreasing pressure $P_5$. That is, it is known in the art that if a sonic velocity exists through orifice 61, any further decrease in the pressure $P_5$ will not affect the upstream pressure $P_2$. This condition is referred to by those skilled in the art as a choked flow or sonic condition. The choked flow or sonic condition occurs when the ratio of the pressure $P_5$ to $P_2$ is less than what is known as the critical pressure ratio (.528 for air). For example, if the pressure $P_2$ was 10 p.s.i.a and the pressure $P_5$ was .528 p.s.i.a. a decrease of pressure $P_5$ to 2 p.s.i.a. would not cause the pressure $P_2$ to decrease but an increase of $P_5$ from 5.28 p.s.i.a. to a value above 5.28 p.s.i.a. would cause a corresponding increase in $P_2$.

In the series of resistors 63, 65, 68, 70, 72, 74, and 76 the sonic condition does not occur. Instead of having a large pressure drop and hence a critical pressure ratio occurring across a single resistor thus causing a sonic condition, such as in resistor 61, a large pressure drop is formed by a series of small pressure drops occurring across each resistor, and hence no critical pressure ratio is present across the series of resistors to cause a sonic condition in any of the series of resistors. In order to insure the nonsonic condition in the series of resistors connecting passage 54 to passage 77 it is necessary to have more than a single resistor. Seven resistors are shown but I have used as few as two and as many as fifty-three resistors to obtain the desired small pressure drop across each resistor. However, if a different type of resistance is used, such as a laminar resistance which doesn't go sonic, only one resistor need be used instead of a series. In other words, when there is a small pressure drop across every one of a number of resistors there is no large pressure discontinuity or critical pressure ratio across a single resistor causing a choked flow or sonic condition therein. Hence, as the pressure $P_5$ decreases, the pressure $P_3$ continues to decrease and does not remain constant because of a sonic condition such as has occurred in resistor 61. It can readily be seen that if $P_5$ is decreasing in such a manner, the pressure $P_3$ continually decreases as $P_5$ decreases, however, the pressure $P_2$ does not continually decrease because it is limited by the choked flow or sonic condition occurring in fluid resistor 61 and hence tends to remain constant after a critical pressure ratio of .528 (for air) is reached within fluid resistor 61.

Figure 2:
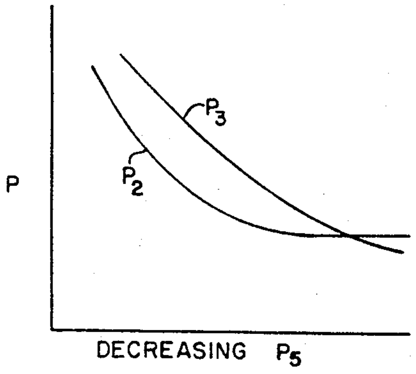
FIGURE 2 shows the relationship of the input control pressures $P_3$ to $P_2$ and the reference Pressure $P_5$.

The curve denoted by $P_3$, shown in FIGURE 2, shows the pressure $P_3$ decreasing with decreasing pressure $P_5$ and the curve denoted by $P_2$ shows the decreasing of pressure $P_2$ with decreasing pressure $P_5$ and the leveling out of the curve $P_2$ after a predetermined pressure $P_5$ is reached. The net effect of this variation in the pressure $P_3$ and $P_2$ shown in FIGURE 2 is that the fluid pressure $P_3$ at control port 16 becomes less than the fluid pressure $P_2$ at control port 15, causing a portion of the fluid stream flowing from power nozzle 14 to flow into outlet leg 18 and therefrom into control port 21 through fluid passage 31. The fluid stream in control passage 21 directs the fluid stream from power nozzle 20 into control passage 27 through outlet leg 23 in fluid passage 33. The fluid signal at control passage 27 directs the fluid stream from power nozzle 25 into outlet leg 29 wherefrom it flows through passage 38 and resistor 37 thus decreasing the pressure $P_4$ at passage 40. Thus, the fluid signal present at passage 40 remains constant while the pressure differential $P_3-P_2$ is constant but when the pressure differential $P_3-P_2$ decreases, the pressure $P_4$ tends to decrease as shown in FIGURE 3.

While I have shown and described a specific embodiment of my invention, further modifications and improvements will occur to those skilled in the art. I desire it to be understood, therefore, that this invention is not limited to the particular form shown, and I intend in the appended claims to cover all modifications which do not depart from the spirit or scope of this invention.

I claim:

1. Apparatus of the class described comprising in combination:

an input passage adapted to be connected to a source of constant pressure;

an output passage adapted to be connected to a source of variable pressure;

first and second fluid resistance means connected in series between said input passage and said output passage;

third and fourth fluid resistance means connected in series between said input passage and said output passage;

said second fluid resistance means configured so that when a predetermined pressure is reached in said output passage said second fluid resistance operates in a sonic condition to hold the pressure between said first and said second resistance means constant with changes in pressure below the predetermined pressure in said output passage; and said fourth fluid resistance means configured so that changes in the pressure in said output passage cause the pressure between said third and fourth fluid resistance means to change with changes in pressure below the predetermined pressure in said output passage.

2. The apparatus of claim 1 including means connected between the junction of the first and second fluid resistor means and the junction between the third and fourth fluid resistance means to receive the pressures therefrom.

3. The apparatus of claim 1 wherein said fourth fluid resistance means comprises at least two fluid resistors in series.

4. The apparatus of claim 1 wherein fluid amplifier means are connected between the junction of the first and second fluid resistance means and the junction between the third and fourth fluid resistance means.

5. The apparatus of claim 4 wherein said fluid amplifier means comprises a set of proportional fluid amplifiers.

6. Apparatus of the class described comprising:

an input passage for supplying a fluid at a constant pressure;

first fluid resistance means connected to said input passage so as to receive fluid therefrom;

second fluid resistance means connected to said input passage so as to receive fluid therefrom;

third fluid resistance means connected to said first fluid resistance means;

first signal output means in communication with said second fluid resistance means;

second signal output means in communication with said first and said third fluid resistance means;

a fluid exhaust passage connected to said third fluid resistance means and adapted to exhaust fluid into a region of variable pressure;

said third fluid resistance configured so as to operate in a sonic condition to hold a pressure at said second signal output means constant with decreases of the pressure in the region of variable pressure below a predetermined level; and pressure responsive means connected between said first and said second signal output means.

7. The apparatus of claim 6 wherein said pressure responsive means comprises fluid amplifier means.

References Cited

UNITED STATES PATENTS

| | | | |
|---|---|---|---|
| 3,068,880 | 12/1962 | Riotdan | 137—81.5 |
| 3,155,825 | 11/1964 | Boothe | 137—81.5 XR |
| 3,238,959 | 3/1966 | Bowles | 137—81.5 |
| 3,314,294 | 4/1967 | Colston | 137—81.5 XR |
| 3,339,571 | 9/1967 | Hatch | 137—81.5 |

OTHER REFERENCES

"Generating Timed Pneumatic Pulses," R. E. Norwood, I.B.M. Technical Disclosure Bulletin, vol. 5, No. 9, February 1963, pp. 13, 14.

SAMUEL SCOTT, *Primary Examiner.*